United States Patent
Gilliland

(10) Patent No.: US 7,706,484 B2
(45) Date of Patent: Apr. 27, 2010

(54) COHERENT FREQUENCY CLOCK GENERATION AND SPECTRUM MANAGEMENT WITH NON-COHERENT PHASE

(75) Inventor: Don A. Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 938 days.

(21) Appl. No.: 11/425,769

(22) Filed: Jun. 22, 2006

(65) Prior Publication Data

US 2007/0297550 A1    Dec. 27, 2007

(51) Int. Cl.
*H03K 5/01* (2006.01)
*H03L 7/00* (2006.01)
(52) U.S. Cl. ...................... 375/346; 327/144
(58) Field of Classification Search .......... 375/360, 375/359, 354, 316, 326, 325, 324, 322, 338, 375/339, 348, 347, 346, 376, 375, 374, 373, 375/368, 365, 362; 327/144, 141, 152, 153, 327/161, 162
See application file for complete search history.

(56) References Cited

U.S. PATENT DOCUMENTS

| 4,899,157 A | * | 2/1990 | Sanford et al. | 342/40 |
| 2006/0025094 A1 | * | 2/2006 | Ozawa et al. | 455/208 |
| 2007/0274399 A1 | * | 11/2007 | Sakai et al. | 375/240.26 |

* cited by examiner

*Primary Examiner*—Temesghen Ghebretinsae
*Assistant Examiner*—Jeffrey Parker
(74) *Attorney, Agent, or Firm*—Bochhop & Associates LLC

(57) ABSTRACT

In a method for reducing electromagnetic interference in a clocked circuit, the clock circuit includes at least a first clock signal and a second clock signal. The method detects when a first transition of the first clock signal is substantially aligned with a corresponding second transition of the second clock signal. The second clock signal is delayed by a predetermined amount of time when the first transition is substantially aligned with the second transition.

5 Claims, 3 Drawing Sheets

COHERENT FREQUENCY CLOCK GENERATION AND SPECTRUM MANAGEMENT WITH NON-COHERENT PHASE

BACKGROUND OF THE INVENTION

1. Field of the Invention

The present invention relates to digital circuits and, more specifically, to a circuit that controls multiple clocking signals to reduce electromagnetic interference.

2. Description of the Prior Art

The peripheral component interconnect (PCI) standard specifies a computer bus for attaching peripheral devices to a computer motherboard. These devices can take the form of integrated circuits fitted onto the motherboard itself (called planar devices in the PCI specification) or expansion cards that fit in sockets. The PCI bus is common in modern PCs, but it also appears in many other computer types. The PCI specification covers the physical size of the bus (including wire spacing), electrical characteristics, bus timing, and protocols.

Most digital circuits employ some sort of clocking circuit to generate a series of clock pulses that activate latches throughout the circuit. When a clock pulse is asserted, a latch is enabled to acquire and store a data value from a logic unit. By asserting clock pulses periodically, data values are able to propagate through the circuit in an orderly manner, thereby ensuring that any given data unit is correctly paired with a corresponding data unit at the beginning of a logical operation.

More complex digital circuits often employ several different clocks, sometimes operating at different frequencies. Also, in some circuits many latches may need to be activated simultaneously, but a single clock circuit may lack sufficient power to drive all of the latches. Therefore, it is common to regenerate clock signals through the use of a "clock tree." Essentially, a clock tree includes a plurality of drivers that receive a clock signal and replicate it with power restored to the original level, to several different clock signal lines.

Some clock signals are received by circuits that employ phase locked loops (PLLs) that sense when a given clock pulse is slightly out of phase with sequential pulses in a clock signal and correct a pulse when such an out of phase relationship is detected. Thus, a slight delay in a received clock pulse will not interfere with the normal timing of operations in a synchronous circuit.

Each clock signal generates some electromagnetic radiation when being asserted. Typically, this electromagnetic radiation is insignificant in simple circuits, but in more complex circuits it is referred to as electromagnetic interference (EMI). When several different clock signals are asserted coherently, the combined EMI from the clock signals can be enough to interfere with the normal operation of the circuit. This problem may be especially critical in high density circuits, such as those employed in PCI applications.

In a representative timing diagram 10 of a prior art system, shown in FIG. 1, (showing only relative amounts and not corresponding to any actual units of measurement) a first clock signal 12, a second clock signal 14 and a third clock signal 16 each include a plurality of periodic transitions, such a rising edges and falling edges. An indication of EMI level 20 demonstrates that when transitions of two of the clock signals are substantially aligned, then the EMI level 20 increases and when transitions of all three clock signals are aligned, then the EMI level 20 is at its maximum.

Multiple clock signals in a complex circuit can generate EMI spikes that can have a severe disruptive effect on various parts of the circuit. Because the EMI effect occurs in a transient manner (only when several signals are in alignment), the effect of the EMI spikes can be particularly hard to debug.

EMI is not only a concern for interoperability but it is also limited by regulatory agencies. For example, FCC regulations limit the amount of EMI that may be given off by a machine. Also, CISPR country requirements limit EMI in order to ship machines to member countries. While a machine might be perfectly operable, it cannot be sold if its EMI level exceeds regulatory limits.

Therefore, there is a need for a system that reduces electromagnetic interference in a circuit due to coherent clock pulses from different clock signals.

SUMMARY OF THE INVENTION

The disadvantages of the prior art are overcome by the present invention which, in one aspect, is a method for reducing electromagnetic interference in a clocked circuit, including at least a first clock signal and a second clock signal. The method detects when a first transition of the first clock signal is substantially aligned with a corresponding second transition of the second clock signal. The second clock signal is delayed by a predetermined amount of time when the first transition is substantially aligned with the second transition.

In another aspect, the invention is a method of reducing electromagnetic interference in a circuit between a first clock signal and a second clock signal, in which a selected one of the first clock signal and the second clock signal is delayed when the first clock signal exhibits a first transition that is substantially aligned with a second transition exhibited by the second clock signal. The selected one of the first clock signal and the second clock signal is allowed to propagate normally when the first transition is not substantially aligned with the second transition.

In yet another aspect, the invention is a clock management circuit, for managing at least a first clock signal and a second clock signal. A first detector detects a first transition of the first clock signal. A second detector detects a second transition of the second clock signal. A first comparison circuit compares the first transition to the second transition and asserts a delay second signal when the first transition is in substantial alignment with the second transition. A first delay circuit delays the second clock signal when the first delay signal is asserted.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
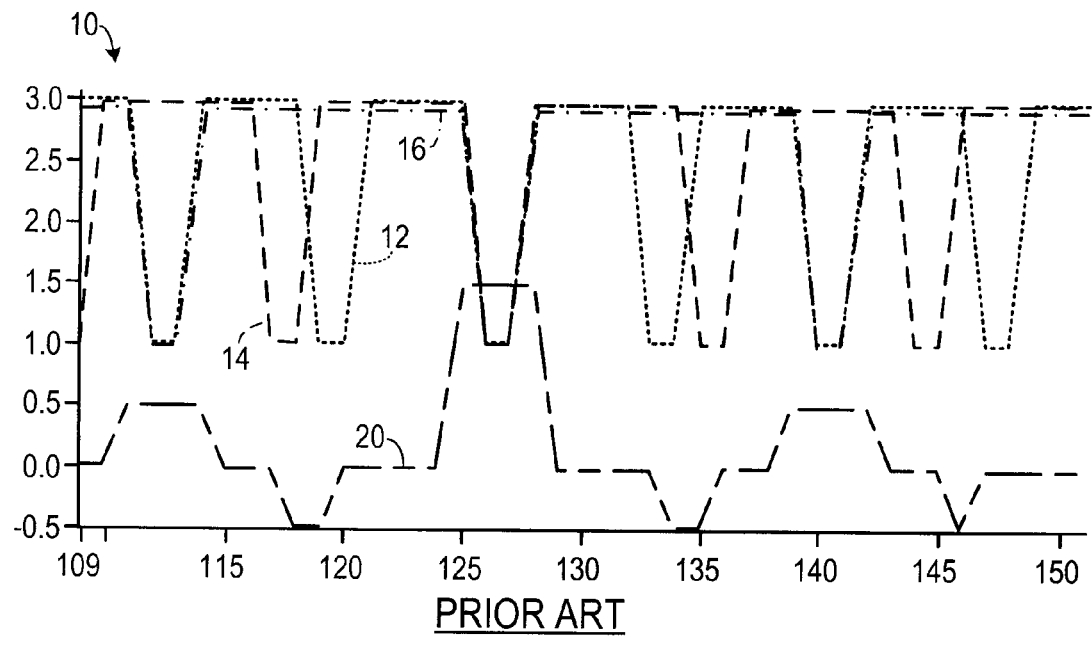
FIG. 1 is a timing diagram corresponding to a prior art system.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 2:
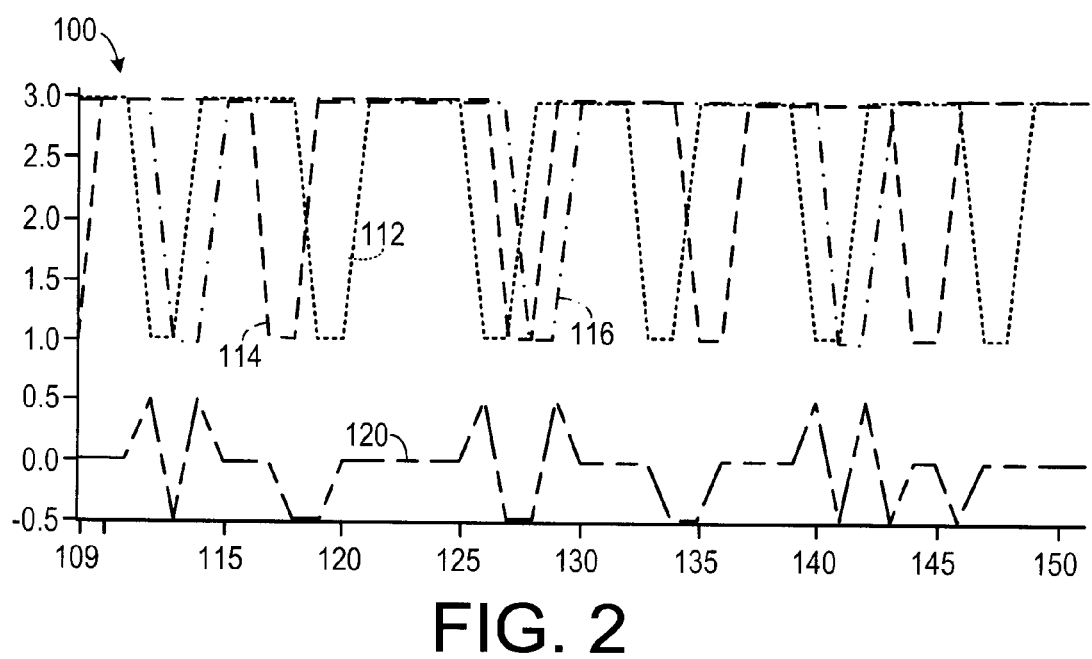
FIG. 2 is a timing diagram corresponding to one illustrative embodiment of the invention.

Emissions from coherently driven clocks can be reduced if the rising edges of the clocks do not occur in phase. One embodiment of the invention detects simultaneous transitions between a plurality of clock signals. When a simultaneous transition occurs, one of the clock signals is delayed, thereby inhibiting simultaneous transitions. For example, as shown in the diagram 100 of FIG. 2, in a representative three clock signal system, when the first clock signal 112, the second clock signal 114 and the third clock signal 116 are manipulated to prevent simultaneous transitions, the maximum EMI level 120 output by the clocks is reduced.

In one embodiment, an EMI prevention system detects when a first transition of the first clock signal is substantially aligned with a corresponding second transition of the second clock signal (which may be done by comparing the slope and the direction of the first transition to the slope and direction of the second transition). If the first transition is substantially aligned with the second transition, then the system delays the second clock signal by a predetermined amount of time.

Figure 3:
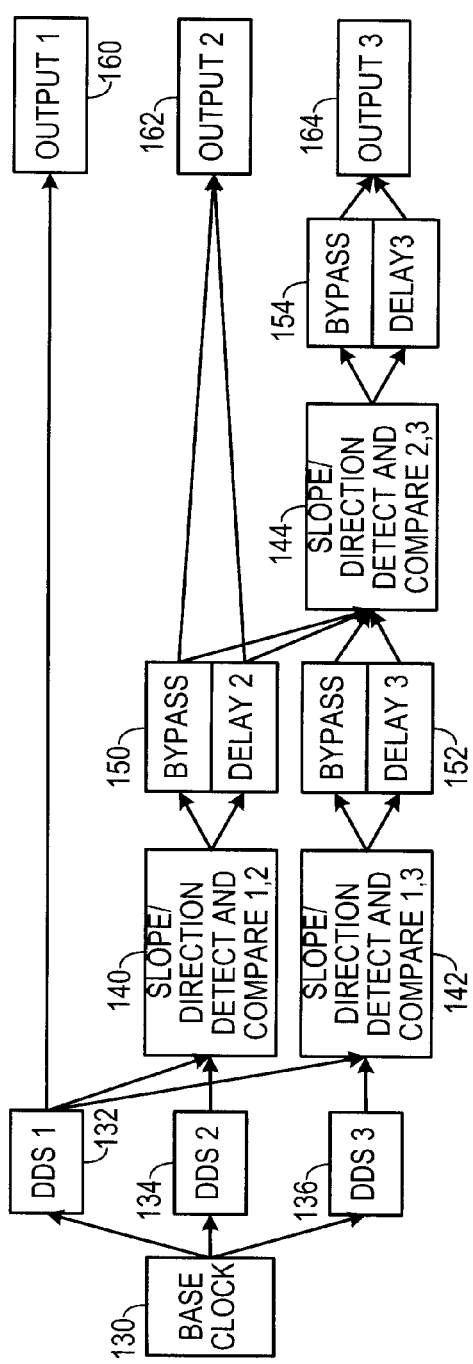
FIG. 3 is a block diagram of a device that may be used evaluate clock signal slope and modify clock signal timing in response thereto.

In one physical embodiment, as shown in FIG. 3, the detection and delay can be accomplished on a clocking system that regenerates a clock signal from a base clocking circuit 130 through a first direct digital synthesizer (DDS) 132 that generates a first output 160, a second DDS 134 that generates a second output 162 and a third DDS 136 that generates a third output 164. The output of the first DDS 132 is compared to the output of the second DDS 134 with a first slope and direction detect and compare (SDDC) circuit 140. The SDDC could, for example, include a phase detector. A first selective delay circuit 150 allows the output of the second DDS 134 to propagate directly to the second output 162 if the first SDDC circuit 140 indicates that the two signals do not have simultaneous transitions. Otherwise, first selective delay circuit 150 delays the output by a predetermined amount of time prior to propagating to the second output 162. Similarly, the output of the first DDS 132 is compared to the output of the third DDS 136 with a second SDDC 142 and a second selective delay circuit 152 delays the output of the third DDS 136 if the second SDDC 142 detects a simultaneous transition. Otherwise the output is allowed to propagate past the second selective delay circuit 152 without delay. Once through the second selective delay circuit 152 the output of the third DDS 136 is compared to the output of the second DDS 134 (after it has passed through the first s elective delay circuit 150) with a third SDDC 144. If there are no simultaneous transitions at this stage, a third selective delay circuit 154 allows the signal to pass directly to the third output 164, otherwise it is delayed by a predetermined amount of time and then allowed to propagate. In this embodiment, the signal from the third DDS 136 has a lower frequency than the signal from both the first DDS 132 and the second DDS 134. Similarly, the signal from the second DDS 134 has a lower frequency than the signal from the first DDS 132.

If these clock signals are used in an asynchronous system, then the slight added delay will be of little or no consequence. However, in a synchronous system, the clock signals can be re-synchronized (e.g., through use of a phase locked loop) once they are received by their respective outputs.

In one representative prototype, a system according to the invention included a main clock chip used to derive several sub clocks coherently. Before the clocks were output, the system ensured that the phase of the clocks (i.e., rise time versus rise time) did not occur simultaneously. In one example, as applied to peripheral component interconnect (PCI) clocks, a 133 MHz clock was run and redriven to three sets of slots because the drivers could not handle the fan out required for all the slots. The output frequencies were close to each other (about 120 kHz apart) and yet were still within specifications while ensuring that the clock phases did not occur at the same time. This was done by delaying the clock pulses within the system. Driven to phase locked loops the driven PCI cards synchronized themselves up to the main clock and handled any single delay in the pulse train.

While redriving is important, clock redriver chips can include multiplication and division. In many such applications, these redriven clocks need not be driven in-phase and thus EMI can be reduced by delaying the clocks with respect to each other.

The system uses a typical DDS (direct digital synthesizer) block but determines the exact slope and direction of the signal rise and fall. If the rise (or fall) of one signal was set to occur with the rise (or fall) of another signal, the slower clock of the two is delayed. The slower clock typically should be delayed since it represents a smaller percentage change of the overall period of the slower clock and thus introduces less error.

Figure 4:
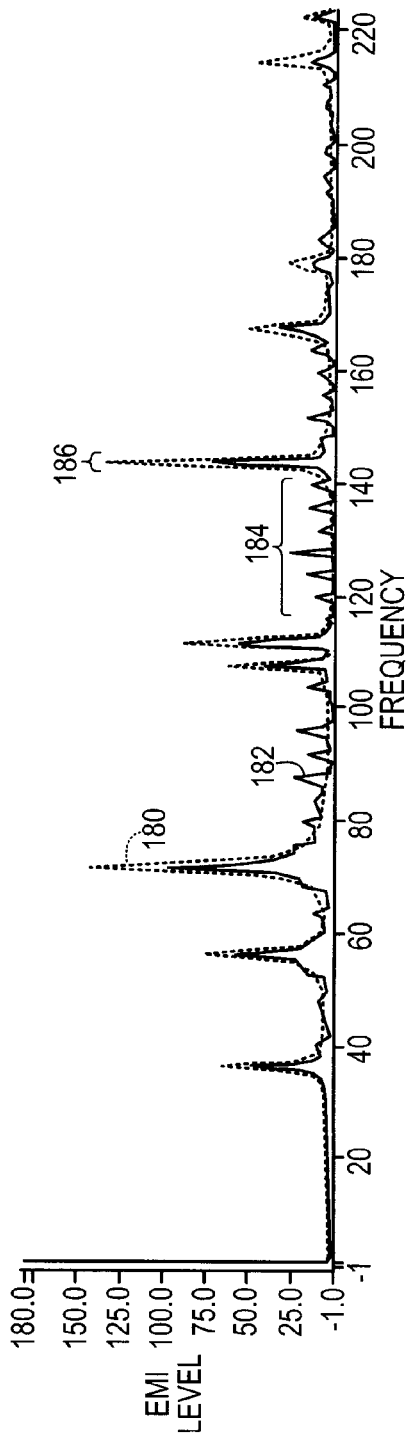
FIG. 4 is a frequency diagram showing a frequency spectrum comparison of EMI resulting from a circuit employing a FIG. 5 is a first embodiment of a delay stage that may be employed with the invention.

The overall system handles the delays that occur in the time domain to reduce EMI in the frequency domain. By preventing simultaneous transitions of the clock signals, the EMI of the system may have more frequency component spikes, but the intensity of those spikes is reduced. As shown in FIG. 4, a frequency component graph 182 of EMI from a circuit employing the invention would have smaller frequency component peaks than a comparable chart 180 for prior art circuits. While frequency component graph 182 does exhibit more low-level frequency component peaks (e.g., item 184), these low-level peaks are not likely to interfere with other circuits because of their low intensity. However, the reduction in intensity of the maximum peaks (e.g., item 186) results in fewer harmful EMI effects to other circuits.

Figure 5:
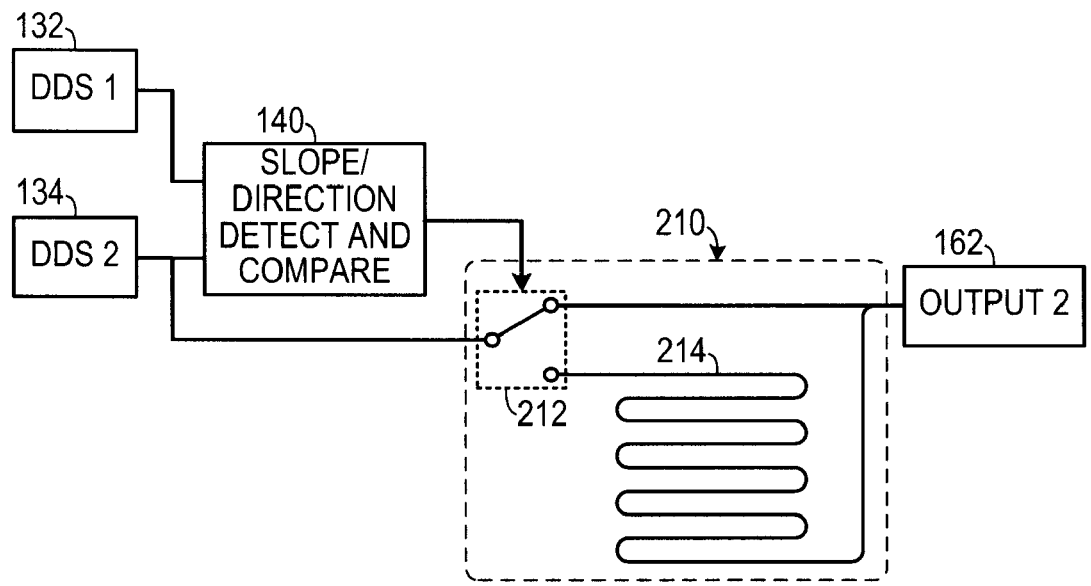
Figure 6:
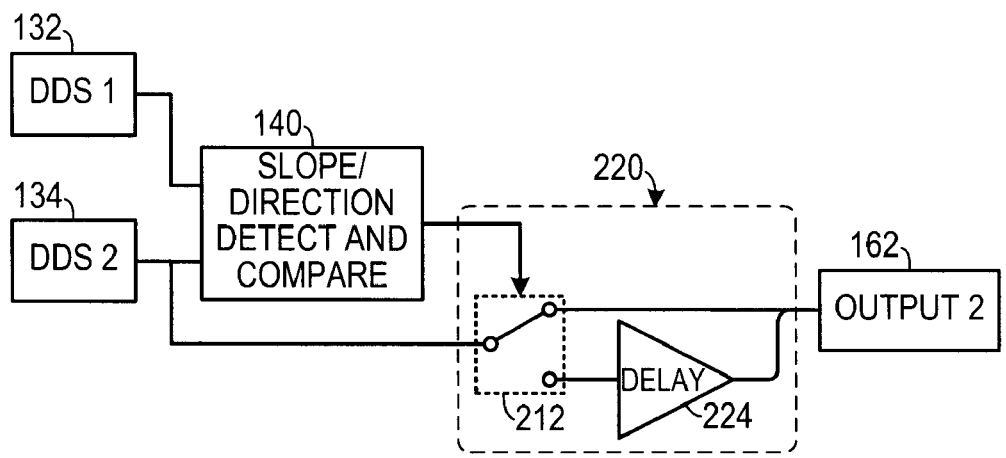
FIG. 6 is a second embodiment of a delay stage that may be employed with the invention.

A first embodiment of a selective delay circuit 210 is shown in FIG. 5. In this embodiment, the outputs of the first DDS 132 and the second DDS 134 are both fed into an SDDC 140, which controls a switch 212. The switch 212 can selectively connect the output of the second DDS 134 either directly to output 162 or force it to pass through a delay line 214. In a second embodiment of a selective delay circuit 220, as shown in FIG. 6, a delay gate 224 (such as a driver or other solid-state circuit) may be used as a delay element.

While the above embodiments show only three clock signals for the sake of simplicity, the process may be expanded to a multitude of driven clock signals. The output of each DDS module is compared to the following (slower) modules to check slopes and directions. If they are the same, then the slower clock is delayed. That signal is then passed onto the next comparison block, and so on. If the slopes and directions are not equal then the signal is not delayed but is passed onto the next block or output. One alternate embodiment brings the slope/direction detect and compare signal back to the DDS module and in effect adds a number to the internal phase accumulator which will change the phase starting point of the clock signal.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method for reducing electromagnetic interference in a clocked circuit, comprising the actions of:
    a. generating a base clock signal;
    b. generating a first copy of the base clock signal, a second copy of the base clock signal and a third copy of the base clock signal;
    c. transmitting the first copy of the base clock signal to a first output;
    d. comparing a first transition in the first copy of the base clock signal to a second transition in the second copy of the base clock signal;
    e. transmitting the second copy of the base clock signal to a second output when the first transition is not concurrent with the second transition and generating a delayed copy of the second copy of the base clock signal when the first transition is concurrent with the second transition;
    f. comparing the first transition in the first copy of the base clock signal to a third transition in the third copy of the base clock signal;
    g. transmitting the third copy of the base clock signal to an intermediate node when the first transition is not concurrent with the third transition and generating a delayed copy of the third copy of the base clock signal when the first transition is concurrent with the third transition;
    h. comparing a fourth transition in a signal at the second output to a fifth transition in a signal at the intermediate node;
    i. transmitting the signal at the intermediate node to a third output when the fourth transition is not concurrent with the fifth transition and generating a delayed copy of the signal at the intermediate node and transmitting the delayed copy of the signal at the intermediate node to the third output when the fourth transition is concurrent with the fifth transition.

2. A clock management circuit, comprising:
    a. a base clock signal generator that generates a base clock signal;
    b. at least a first direct digital synthesizer responsive to the base clock signal generator and configured to generate a first copy of the base clock signal that is transmitted to a first output, a second direct digital synthesizer responsive to the base clock signal generator and configured to generate a second copy of the base clock signal and a third direct digital synthesizer responsive to the base clock signal generator and configured to generate a third copy of the base clock signal;
    c. a first slope detection and comparison circuit that is configured to detect a first transition in the first copy of the base clock signal and a second transition in the second copy of the base clock signal and that is configured to transmit the second copy of the base clock signal to a second output if the first transition is not concurrent with the second transition and that is configured to transmit the second copy of the base clock signal to a delay element configured to transmit a delayed copy of the second copy of the base clock signal to the second output if the first transition is concurrent with the second transition;
    d. a second slope detection and comparison circuit that is configured to detect the first transition in the first copy of the base clock signal and a third transition in the third copy of the base clock signal and that is configured to transmit the third copy of the base clock signal to an intermediate node if the first transition is not concurrent with the third transition and that is configured to transmit the third copy of the base clock signal to a delay element configured to transmit a delayed copy of the third copy of the base clock signal to the intermediate node if the first transition is concurrent with the third transition;
    e. a third slope detection and comparison circuit that is configured to detect a fourth transition in a signal at the second output to a fifth transition in a signal at the intermediate node and that is configured to transmit the signal from the intermediate node to a third output if the fourth transition is not concurrent with the fifth transition and that is configured to transmit the signal from the intermediate node to a delay element configured to transmit a delayed copy of the signal from the intermediate node to the third output if the fourth transition is concurrent with the fifth transition.

3. The clock management circuit of claim 2, wherein the first slope detection and comparison circuit, the second slope detection and comparison circuit and the third slope detection and comparison circuit each comprise a phase detector.

4. The clock management circuit of claim 2, wherein each delay element comprises a delay line.

5. The clock management circuit of claim 2, wherein each delay element comprises delay gate through which the second clock signal propagates.

* * * * *